United States Patent [19]

Alablanche et al.

[11] Patent Number: 5,140,604
[45] Date of Patent: Aug. 18, 1992

[54] MIXED STRONTIUM AND LANTHANIDE OXIDES AND A LASER USING MONOCRYSTALS OF THESE OXIDES

[75] Inventors: Sylvie Alablanche, Paris; Jean-Marie Benitez, Barbizon; Robert Collongues, Bourg la Reine; Jeanine Thery, Paris; Daniel Vivien, Garches, all of France

[73] Assignee: Quartz Et Silice, Courbevoie, France

[21] Appl. No.: 668,874

[22] Filed: Mar. 13, 1991

[30] Foreign Application Priority Data

Mar. 13, 1990 [FR] France .................. 90 03180

[51] Int. Cl.$^5$ .............................. H01S 3/16
[52] U.S. Cl. ............................... 372/41
[58] Field of Search ..................... 372/39, 41

[56] References Cited

FOREIGN PATENT DOCUMENTS 0043776 1/1982 European Pat. Off. .
0227499 7/1987 European Pat. Off. .
0250305 12/1987 European Pat. Off. .
0252784 1/1988 European Pat. Off. .

OTHER PUBLICATIONS

J. Crystal Growth, vol. 85, Nov. 1987, pp. 234-239, Amsterdam, NL; C. D. Brandle et al.: "Czochralski Growth and Evaluation of LaMgA111O19 Based Phosphors".

Primary Examiner—Léon Scott, Jr.
Attorney, Agent, or Firm—Pearne, Gordon, McCoy & Granger

[57] ABSTRACT

Mixed strontium and lanthanide oxides and a laser using monocrystals of these oxides.

These oxides with a magnetolead type crystalline structure have the following formula:

$$Sr_xLn1_{y1}Ln2_{y2}Ln3_{y3}M_zA_aB_bO_{19-k}$$

in which Ln1 represents at least one trivalent element selected from lanthane, gadolinium and yttrium; Ln2 represents at least one trivalent element selected from neodymium, praseodymium, erbium, holmium and thulium; Ln3 represents an element selected from bivalent europium or trivalent cerium with retention of electric neutrality by virtue of oxygen holes; M represents at least one bivalent metal selected from magnesium, manganese and zinc; A represents at least one trivalent metal selected from aluminum and gallium; B represents a trivalent transition metal selected from chromium and titanium; x, y1, y2, y3, z, a, b and k represent numbers so that $0<x<1$, $0\leq y1<1$, $0<y2<1$, $0\leq y3<1$, $0<z<1$, $10.5<a<12$, $0\leq b\leq 0.5$ and $0\leq k\leq 1$ provided that $0<x+y1+y2+y3\leq 1$ and that $11<z+a+b\leq 12$. They exhibit in a monocrystal state (4) laser properties enabling them to be used in power lasers pumped by a laser diode.

24 Claims, 4 Drawing Sheets

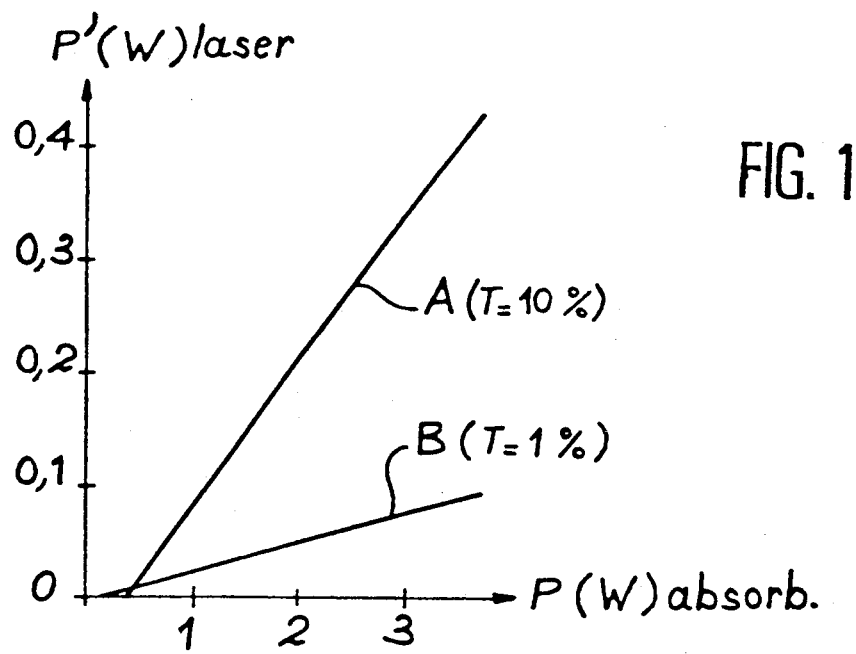
FIG. 1
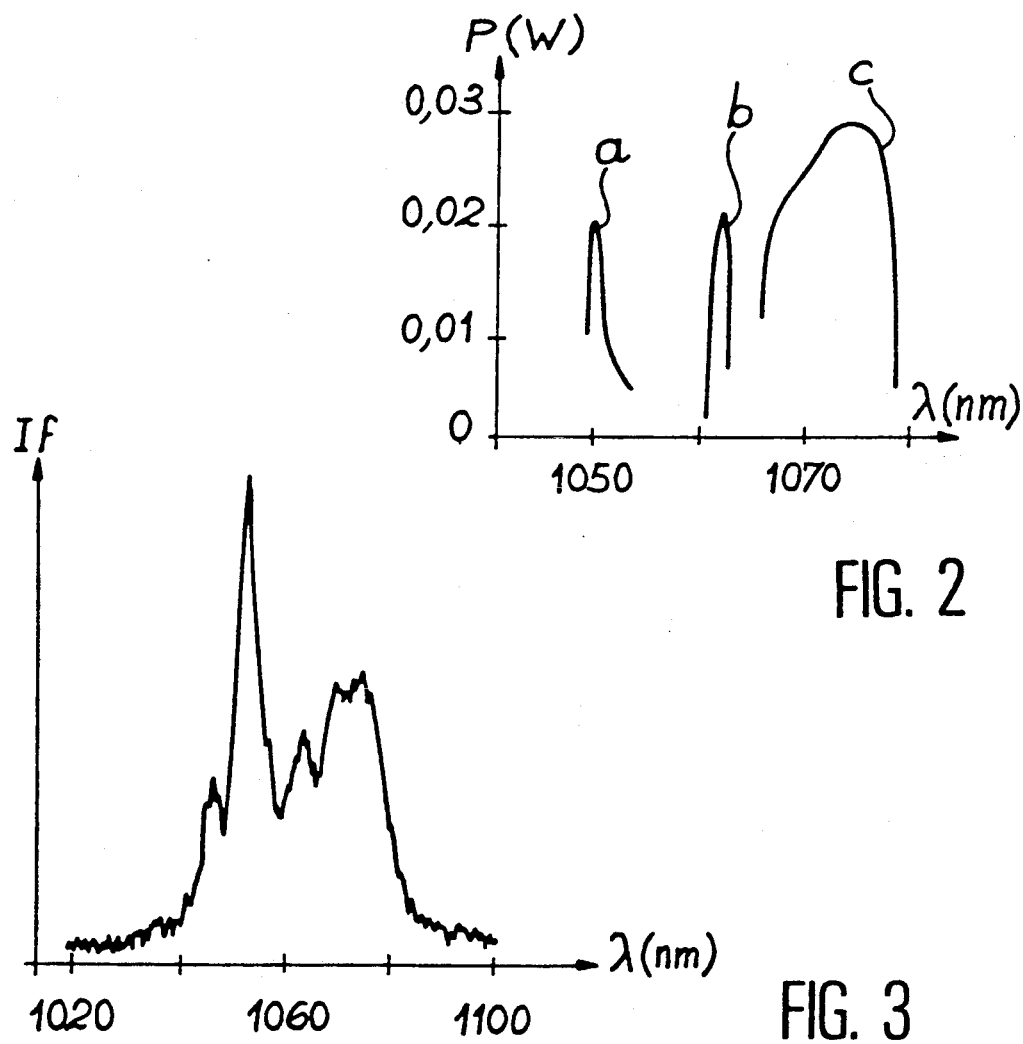
FIG. 2
FIG. 3

MIXED STRONTIUM AND LANTHANIDE OXIDES AND A LASER USING MONOCRYSTALS OF THESE OXIDES

FIELD OF THE INVENTION

The present invention concerns mixed single-phase strontium and lanthanide oxides having the crystalline structure of magnetolead and obtained in the form of monocrystals.

BACKGROUND OF THE INVENTION

The present invention is applicable to microlaser with integrated optics applications, optical fiber telecommunications applications, medical applications (microsurgery, skin treatment) and semiconductor research, as well as power laser applications, these lasers emitting in the infrared spectrum (1000 to 3000 nm) or in the visible spectrum making it possible to carry out treatments of materials (welds, piercings, markings, surface treatments), photochemical reactions, controlled thermonuclear fusion or the polarization of the atoms of a gas, such as helium.

These lasers transmit on one or several discrete wavelengths with a certain degree of tuneability.

More specifically, the mixed oxides of the invention are aluminates or gallates.

Like mixed lanthanide aluminates with a magnetolead structure, there also exist lanthane-neodymium-magnesium aluminates, known as LNAs with the chemical formula $La_{1-x}Nd_x MgAl_{11} O_{19}$ with $0<x\leq 1$ and in particular $x=0.1$. These aluminates form the subject of the patents FR-A-2 448 134 and EP-A-0 043 776 and are referred to in the publication by D. Shearer and al., Journal of Quantum Electronics, vol. QE-22, No 5, 1986, p. 713-717 and entitled "LNA: a new CW Nd laser tunable around 1.05 and 1.8 $\mu m$".

These mixed aluminates obtained in a monocrystalline form exhibit optical properties similar to those possessed by yttrium garnet and aluminium doped with neodymium, known under the abbreviation YAG:Nd$^{3+}$, and neodymium ultraphosphate ($NdP_5 O_{14}$); these lasers also transmit in the infrared spectrum.

In particular, the LNA has laser emission wavelengths at 1054 and 1082 nm framing that of the YAG at 1064 nm. In addition, it has another transmission wavelength domain at about 1320 nm, a domain corresponding to the lowest attenuation by silicon optical fibers, thus allowing for transmission by optical fibers of the greatest amount of information with minimum losses.

However, the production of these aluminates in the form of monocrystals, and in particular by means of the Czochralski method most currently used in industrial applications, may result in crystals with unsatisfactory quality when industrial applications require power lasers to have large dimensions.

Moreover, the growth of these crystals is effected naturally along the crystallographic direction a. Now, the crystallographic direction c corresponding to the optical axis of the crystal is much more advantageous for laser properties and results in obtaining higher yields.

In addition, the use of a crystal whose crystallographic axis c is merged with the optical axis of the laser allows for an improved evacuation of heat and thus an improved cooling of the emitting bar when using a crystal those crystallographic axis a is merged with the optical axis; this is tied to the fact that thermic conductivity is anisotropic; it is much higher in the direction a than in the direction c.

So as to obtain an LNA bar orientated along the direction c, a Czochralski growth is then effected along the direction a, and then a sampling (or core sampling) is made of the bar obtained along the axis c. This slightly complicates the production of the laser transmitter.

In addition, the use of a bar orientated along the axis c allows for a power rise due to the improved heat removal.

The low yield of LNA laser transmission, independently of the growth problems of the latter, is due mainly to the self-extinguishing phenomenon thus limiting the quantity of the neodymium responsible for the laser effect able to be introduced into the crystal without impairing fluorescence. In the LNA, the maximum quantity of neodymium ions able to be introduced is equal to $10^{21}$ ions $Nd^{3+}/cm^3$, which corresponds to $x=0.25$, the maximum laser intensity being obtained for x being close to 0.1.

In the LNA, the neodymium may occupy 3 crystalline sites of the structure (see the above-mentioned article by D. Shearer), which means that this neodymium exhibits defects which adversely affect heat propagation and thus the power rise of the laser. In addition, the presence of several sites for the neodymium favors self-extinction.

The partial substitution of the aluminum in the LNA by gallium with a view to improving the yield of the laser transmission by increasing the quantity of the neodymium in the structure has been described in the document FR-A-2 599 733. However, the production of the corresponding monocrystals suffers from various drawbacks (existence of bubbles, defects) due mainly to fusion non-congruence.

As another known aluminium oxide, it is possible to cite the strontium aluminate doped with neodymium having the formula $SrAl_{12} O_{19}:Nd^{3+}$. This oxide is referred to in a publication by Kh. S. Bagsasarov and al. and entitled "Stimulated emission of $Nd^{3+}$ ions in an $SrAl_{12}O_{19}$ crystal at the transitions $^4 F_{3/2}$--- $I_{11/2}$ and $F_{3/2}$ --- $I_{11/2}$ in Sov. Phys. Dokl; vol. 19; No. 6, December 1974, pp. 350.

The neodymium ions in this strontium oxide may occupy several sites, thus limiting laser emission power. In addition, the crystals obtained exhibit insufficient qualities to enable them to be used in industrial laser applications and in particular in power lasers. Furthermore, the quantity of neodymium able to be introduced into this strontium oxide is extremely low, which contributes again to limiting laser power.

The document U.S. Pat. No. 4,441,049 also relates to known mixed lanthane/magnesium gallates containing strontium doped with manganese and having luminescent properties but no laser effect. These gallates are used particularly for fluorescent lighting. Furthermore, they solely exist in a powder form.

Gadolium/magnesium/strontium aluminates doped with cerium are obtained in a pulverulent form and also have luminescent properties, but no laser effect, are mentioned in the document FR-A-2 442 264.

SUMMARY OF THE INVENTION

The object of the invention is to provide new mixed strontium and lanthanide oxides able to be used as laser emitters and making it possible to overcome the aforesaid drawbacks.

In particular, these new oxides may be embodied in the form of large monocrystals freed from bubbles and defects by means of the Czochralski method and having a laser emission whose yield is greater than that of the mixed neodymium aluminates referred to earlier. Thus, these oxides may be used in power laser industrial applications.

Morever, these strontium oxides naturally increase along the crystallographic direction c, which provides them with improved thermic properties facilitating their power rise.

In addition, these oxides allow for a larger quantity of activating ions, contrary to the case with the LNA or the strontium oxide doped with neodymium mentioned above, without adversely affecting the laser effect and further increasing the emitted luminous power.

More specifically, the object of the invention is to provide single-phase oxides mixed with strontium and neodymium having a magnetolead type structure with the formula (I):

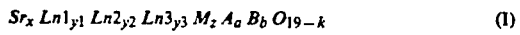
$$Sr_x Ln1_{y1} Ln2_{y2} Ln3_{y3} M_z A_a B_b O_{19-k} \qquad (1)$$

in which Ln1 represents at least one trivalent element selected from lanthane, gadolinium and yttrium; Ln2 represents at least one trivalent element selected from neodymium, praseodymium, erbium, holmium and thulium; Ln3 represents at least one element selected from bivalent europium and trivalent cerium with preservation of electric neutrality by virtue of oxygen gaps; M represents at least one bivalent metal selected from magnesium, manganese and zinc; A represents at least one trivalent metal selected from aluminum and gallium; B represents at least one trivalent transition metal selected from chromium and titanium; x, y1, y2, y3, z, a, b and k represent numbers so that $0<x<1$, $0\leq y1<1$, $0<y2<1$, $0\leq y3<1$, $0<z<1$, $10.5<a<12$, $0\leq b\leq 0.5$ and $0\leq k\leq 1$ provided $0<x+y1+y2+y3\leq 1$ and $11<z+a+b\leq 12$.

As indicated earlier, k makes it possible to ensure preservation of electric neutrality.

When Ln3 represents divalent europium, preservation of electric neutrality is ensured by the equation:

$$2x+3(y1+y2)+2y3+2z+3(a+b)=2(19-k).$$

In all the other cases, electric neutrality is ensured by the following equation:

$$2x+3(y1+y2+y3)+2z+3(a+b)=2(19-k).$$

The compounds of the invention may be embodied in a monocrystal form.

Preferably, $x+y1+y2+y3$ satisfies the equation $0.5\leq x+y1+y2+y3\leq 1$.

These mixed oxides exhibit mechanical properties similar to those of aluminium. In addition, their crystalline structure is much closer to that of magnetolead, thus improving their thermic properties compared with the aforesaid known mixed lanthanide aluminates. The more strontium there is in the compounds of the invention, the nearer one approaches the magnetolead structure.

Preferably, x satisfies the equation $0.05\leq x\leq 0.95$ or even better the equation $0.2\leq x\leq 0.95$ and z satisfies the equation $0.05\leq z\leq 0.8$.

These oxides have a hexagonal structure which is composed of spinel blocks separated by mirror planes containing strontium and lanthanides.

In the oxides of the invention, Ln1 is a lanthanide ion acting as a dilutant; Ln2 is a lanthanide ion responsible for the laser effect and known as a laser activator, and Ln3 is a lanthanide ion used as a laser sensitizer. Similarly, the ion B is used as a laser sensitizer.

Contrary to the case with known mixed lanthanide aluminates, the laser activating ion may be introduced at extremely high percentages into the structure, thus increasing laser emission power.

For example, y1, y2 and y3 satisfy the equations $0\leq 1\leq 0.9$, $0.02\leq y2\leq 0.6$ and $0\leq y3\leq 0.6$. Preferably, $0.05\leq y2\leq 0.45$ is selected—or even better $0.15\leq y2\leq 0.25$—to provide good laser effectiveness.

The oxides of the invention may be used as laser emitters within a wide range of wavelengths, these wavelengths depending on the nature of the activating ion. Also, the object of the invention is to provide a laser comprising as a laser emitter an oxide, such as the one described earlier.

When in formula (I) Ln2 represents neodymium, the corresponding mixed oxides embodied in the form of monocrystals may be used as laser emitters, especially in power lasers emitting at 1049.8 nm, 1061.8 nm with a relatively narrow tuneability range of about 2 nm. In addition, these oxides with neodymium exhibit a much wider type of emission of about 1074 nm which extends from 1066 nm to 1078 nm, namely over 12 nanometers, which is considerable for a solid laser with neodymium.

The emission wavelengths of an oxide mixed with the neodymium of the invention differ from those of the LNA and those described in the article by Bagdasarov mentioned earlier. In addition, the neodymium oxides of the invention are wavelength-tuneable.

When in formula (I) Ln2 represents holmium, the corresponding mixed oxides in the form of monocrystals may be used as laser emitters, especially in tuneable power lasers, emitting in the infrared spectrum and more particularly on wavelengths ranging from 1500 to 3000 nm.

Tuneability makes it possible in telecommunications applications to carry much more information simultaneously.

Wavelengths close to 3000 nm have the advantage of being absorbed by water. In addition, close to 1500 nm, the eye is no longer sensitive to the laser emission and accordingly is more protected.

With thulium or erbium for Ln2 in formula (I), it is possible to obtain power lasers or microlasers also emitting in the infrared spectrum with a certain element of tuneability.

When Ln2 represents praseodymium, the corresponding mixed oxides in a monocrystal form may be used as laser emitters within the visible spectrum and mainly as regards yellow and red with again a certain element of tuneability.

The lasers using the monocrystalline oxides of the invention may also be used as both pulsed lasers and lasers emitting continuously. When these lasers are power lasers, the luminous beam emitted has an emitted power ranging from several watts to several hundreds of watts.

So as to embody peopling of the excited state E1 where population inversion is carried out, the activating ions are excited up to a level of energy E2 greater than the excited state E1; the peopling of the state E2 is obtained by light absorption known as optical pumping. As the energy level E2 is extremely unstable, the luminescent ions are de-energized spontaneously up to the energy state E1. Passage from the state E1 to the fundamental E0 corresponds to the laser emission.

Given the fact that the absorption peaks of the lanthanides and in particular of the neodymium and praseodymium are extremely narrow, the partial substitution of the aluminium and gallium by chromium or titanium favors light absorption, these ions having wide absorption bands in the visible spectrum.

Similarly, the partial substitution of the strontium by trivalent cerium or divalent europium also favors optical pumping, these elements having absorption bands as wide as those of chromium or titanium.

After having brought to the excited state by light absorption either of the spectral bands of the sensitizing ions, these ions transfer their energy to the activating ions, thus ensuring the peopling of the energy level E1. This energy transmission is possible as the energy difference between the fundamental state and the excited stated of the chromium, titanium, cerium or europium ions approaches the energy difference between the fundamental state and the overexcited state E2 of the neodymium or praseodymium ions, but also the erbium, thulium and holmium ions.

The sensitizers and laser activators are selected according to the wavelength used for optical pumping and the desired emission wavelength. In the case of neodymium or praseodymium, a cerium/chromium codoping may be favorably envisaged.

Given the fact that the lifetime of the excited state E1 decreases when the quantity of luminous ions increases and that the fluorescence intensity increases inversely when the quantity of luminescent ions increases, the monocrystals for which y2 is small are more particularly adapted to the embodiment of continuously functioning power lasers, whereas the monocrystals for which y2 is larger are better adapted to the production of pulse-functioning power lasers.

In particular, for a continuous emission laser, the optimum amount of activating ions in a given crystal is equal to the one which provides maximum light intensity, whereas for a pulse laser, the amount of activating ions may exceed this optimum quantity.

When using a sensitizer, the time for transferring the energy of the sensitizer to the activating ions needs to be compatible with that of emission of the activator. In the pulsed mode, too long a transfer time may be disadvantageous, whereas in the continuous mode, this transfer time is not strictly important having regard to the fact that pumping is provided continuously.

Also, as it has a relatively long transfer time, chromium is preferably used as a sensitizer for a laser functioning continuously; on the other hand, cerium or europium may be used in a laser functioning in the pulsed state.

The presence of a bivalent metal, such as magnesium, manganese or zinc, considerably favors the crystal growth of strontium oxides and, for a given quantity of activating ions, makes it possible to obtain crystals having better quality than the quality obtained with strontium oxides without any divalent metal ($SrAl_{12}O_{19}$: Nd in particular). The growth of these crystals is congruent. Moreover, this bivalent metal allows for the introduction of a higher activator percentage than that of the same crystal without this divalent metal.

Generally speaking, the amount of divalent metal is similar, indeed even equal the quantity of lanthanide.

The presence of strontium in the oxides of the invention ensures, as regards the Czochralski method, a crystalline growth along the crystallographic axis c, even in the absence of any monocrystalline germ. This allows for a power rise and makes it possible to cool the emitting bar laterally along the crystallographic direction a, this being required so as to prevent the bar from being transformed into a thermic lens focussing the light and thus preventing the laser effect.

Moreover, for a high concentration of strontium, a single crystalline site is obtained for the activating ion, contrary to the case with known mixed oxides, thus limiting self-extinction problems and making it therefore possible to increase the power of the laser with an equal activating ion concentration.

The strontium and gallium of the oxides of the invention makes it possible, compared with LNA, to lower the force of the crystalline field at the site of the activator and in particular of the neodymium, to reduce the oxygen/activator distance and thus to reduce the self-extinction phenomenon. They also make it possible to increase the amount of activator ions in the crystal with respect to the LNA.

The composition of the oxides of the invention varies from pure aluminate to pure gallate, all intermediate alumino-gallate compositions being able to be envisaged.

The mixed oxides of the invention have the formula (I) in which M represents magnesium and A represents aluminium. The corresponding oxides then have the formula:

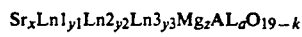

$$Sr_xLn1_{y1}Ln2_{y2}Ln3_{y3}Mg_zAL_aO_{19-k}$$

The simultaneous use of strontium and a lanthanide playing the role of a dilutant make it possible to modify the composition of the crystal and adjust the emission wavelength of the laser crystal. Thus, it is possible to adapt the emission wavelength according to the envisaged application.

In particular, the oxides of the invention have the formula:

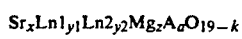

$$Sr_xLn1_{y1}Ln2_{y2}Mg_zA_aO_{19-k}$$

By firstly making y2/y1 vary and secondly (y1+y2)/x, it is possible to simultaneously optimize several properties of the material, such as laser emission intensity and its wavelength. Such a latitude in optimizing the material does not exist as regards LNA and the aluminate of Bagdasarov and al.

BRIEF DESCRIPTION OF THE DRAWINGS

Other characteristics and advantages of the invention shall appear more readily from a reading of the following description, given purely by way of illustration and being non-restrictive, with reference to the accompanying drawings on which:

FIG. 1 is a diagram giving the power (P') in watts emitted by a laser conforming to the invention according to the pumping power (P), expressed in watts, of an ionized argon laser, FIG. 2 represents a tuneability curve giving the emitted power (P) expressed in watts according to the wavelength expressed in nm for a laser emitter of an oxide with the initial formula (II):

$$Sr_{0.8} Nd_{0.2} Mg_{0.2} Al_{11.8} O_{19}, \quad (II)$$

Figure 4:
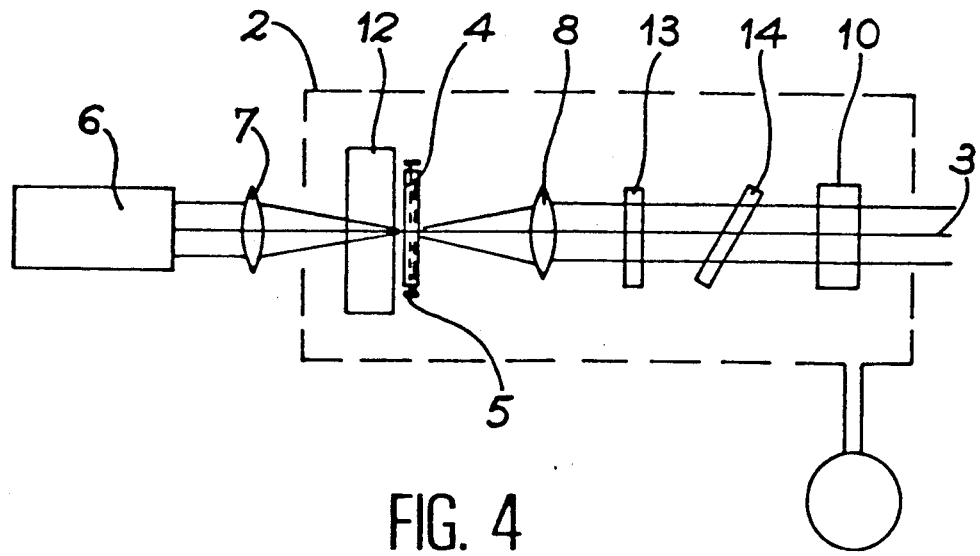
Figure 5:
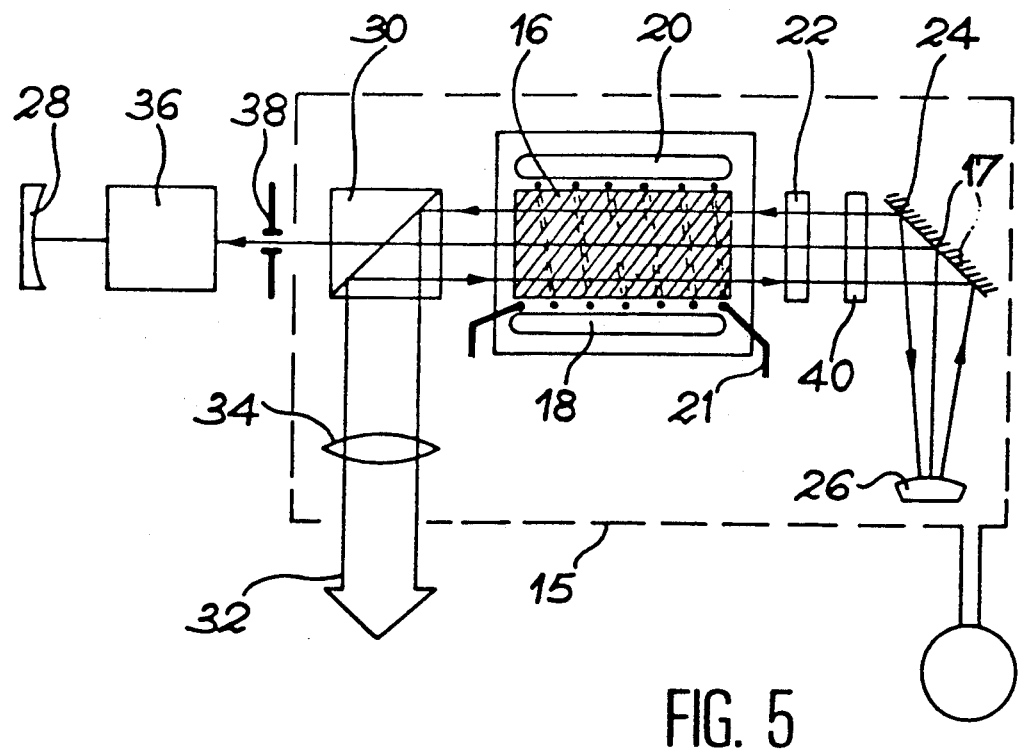
Figure 6:
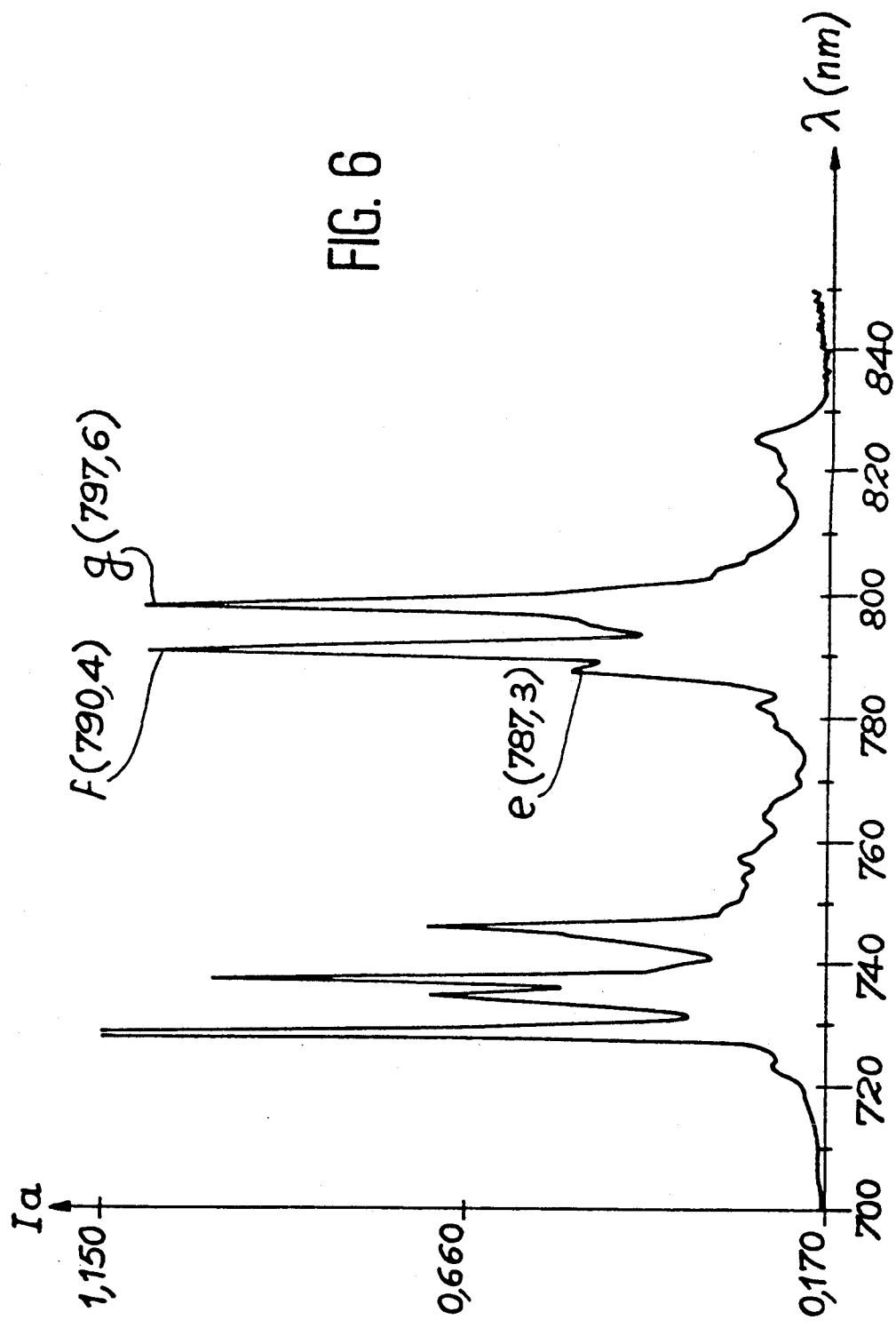
Figure 7:
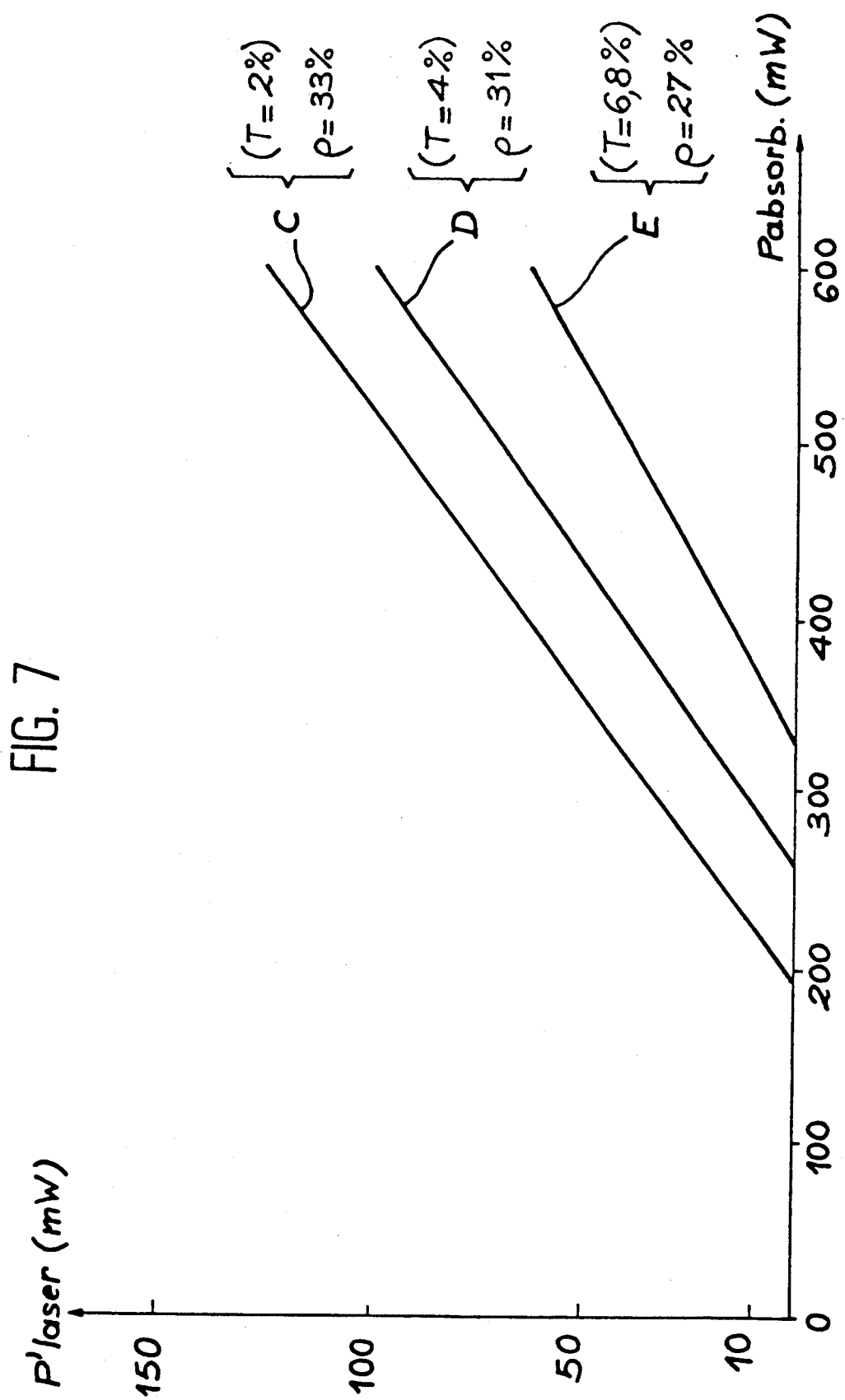

FIG. 3 diagrammatically represents the fluorescence spectrum at 300K of the oxide of the invention with the formula (II), FIG. 4 diagrammatically represents a power laser functioning continuously using a monocrystal of an oxide conforming to the invention, FIG. 5 diagrammatically represents a pulse power laser using a monocrystal of an oxide conforming to the invention, FIG. 6 gives one portion of the absorption spectrum of the monocrystal with the initial formula (II) according to the wavelength expressed in nanometers, and FIG. 7 is a diagram giving the power (P') in watts emitted by a laser conforming to the invention according to the pumping power (P) of a laser diode expressed in watts.

DETAILED DESCRIPTION OF THE PREFERRED EMBODIMENTS

There now follows a description of the embodiment of a monocrystal of a mixed oxide conforming to the invention, this embodiment using the oven technique with radiation concentration, also known under the name of the floating zone technique.

To this effect, the commercial high-purity powders of the oxides of Ln1, Ln2, Ln3, M, A, B, as well as strontium carbonate, are weighed in the desired proportions, mixed for several hours with the aid of a mechanical agitator, and are then shaped into pastilles heated to 1100° C. for 15 hours so as to eliminate the carbonates and carry out a prereaction.

The pastilles are then ground and remixed and parallelpiped-shaped bars 5 cm long for 1 cm of side are formed by compression. The latter are then sintered for 50 hours at between 1400° and 1600° C. until a solid solution is formed and then cut into the shape of cylinders so as to be used in the radiation concentration oven. The sintering temperature depends on the precise composition of the crystal and its choice is that available to the technician.

The compositions have been tested for translation rates of bars between 0.4 and 3.5 cm/hr.

The technique, known as the second passage technique, has also been used: a sintered bar is firstly quickly melted in the radiation concentration oven (1.5 to 3.5 cm/hr) so as to melt the powder and approach theoretical density. The bar obtained is then melted a second time slowly at a rate of 0.4 to 1 cm/hr.

This increasing method has the advantage of being clean (the crystal cannot be polluted as the melted zone is not in contact with a crucible) and fast, since several hours, depending on the translation rate used, are sufficient so as to obtain a crystal.

Monocrystals of oxides conforming to the invention have also been obtained by the Czochralski growth technique. To this effect, commercial high-purity powders of the oxides Ln1, Ln2, Ln3, M, A, B and strontium carbonate weighed in the desired proportions are mixed for several hours with the aid of a mechanical agitator and then compressed into the shape of cylinders. A sintering of 15 hours at 1100° C. is carried out, followed by 50 hours at between 1400° C. and 1600° C.

The sintered mixture is placed in an iridium crucible and brought to melting temperature. Pulling or growing is effected in a nitrogen atmosphere from an iridium rod or germ having the desired orientation.

The pulling rate varies from 0.5 to 1 mm per hour. The speed of rotation varies around 30 revolutions per minute.

These pulling or growing methods also make it possible to operate under a controlled atmosphere (inert or oxidizing) if necessary, especially in the case of compounds containing gallium.

The initial carbonates and oxides used appear in the form of a powder having a granulometry ranging from 1 to 10 micrometers and a purity exceeding 99.99% so as to obtain as high as possible yield for the laser emission. Of course, it is possible to use other initial substances, such as nitrates, as described in the document FR-A-2 599 733, or even chlorides.

When the embodied monocrystals contain titanium, it is possible to carry out a final annealing in the oven at 1100° C. under a reducing atmosphere so that the titanium contained in the structure is in the oxidation state (III), this element commercially existing in the oxidation state IV in the form of $TiO_2$.

Of course, any other crystal growth method using a molten bath, such as the Bridgmann Kyropoulos, self-crucible or Verneuil method, may be used.

Numerous compositions with different Sr/Ln2 ratios with Ln2 representing neodymium or praseodymium have been produced in a monocrystalline form in a radiation concentration oven and their optical properties, such as absorption and fluorescence, have been analyzed.

The annexed table I gives examples of monocrystals of aluminates and/or strontium-lanthanide-magnesium gallates obtained in the radiation concentration oven. The left portion of this table gives the initial mole % composition from which the sintered bars have been produced, the central portion of the table gives the formula of the crystal obtained by zone fusion, and the right portion of the table gives the crystalline parameters of this crystal.

The annexed tables II and III give examples of the monocrystals of strontium-lanthnaide-magnesium aluminates obtained respectively by the Czochralski pulling and Verneuil method. In these two tables, the left portion gives the mole % composition of the initial powder from which the monocrystal is obtained, the central portion gives the formula of the obtained monocrystal and the right portion gives the crystalline parameters of the monocrystal.

The compositions of the crystals obtained have been determined with an electronic microprobe, except for those compositions preceded by an asterisk, the latter not having yet been determined precisely, and the crystalline parameters have been determined by X-ray diffraction.

This study reveals that the composition corresponding to Sr/Nd=4 is quite interesting. This composition is that of example 23 and has lead to an thorough analysis of its laser properties.

Although the Czochralski method for pulling of the compound 23 and the examples 24 to 26 has been effected from an iridium rod and not from a monocrystalline germ, the crystalline perfection of the sample obtained is perfectly suitable for a wide range of applications.

Analysis of the crystalline bar obtained with the aid of a helium-neon laser shows the existance of zones free from diffusing centers.

A perfectly monocrystalline sample has been separated from the crystal 23—as per Czochralski—, by splitting so as to obtain two strictly parallel faces. This appears in the form of a cylindrical plate 20 mm in diameter with a thickness of 7 mm.

The axis of the cylinder is the axis c of the hexagonal structure and corresponds to the known direction so as to be optimal in the case of LNA as regards the laser effect. The sample placed in a laser cavity, such as the one shown in FIG. 4, is longitudinally pumped by the green line of an ionized argon laser. At the wavelength used, namely 514.5 nm, the sample absorbs 60% of the pump radiation.

The laser effect corresponding to the transition $4F_{3/2}$----$I_{11/2}$ of the neodymium is easily obtained and is spontaneously produced for a wavelength of 1049.8 nm.

FIG. 1 gives two curves A and B of the yield of the laser power (P') emitted by the composition crystal 23 according to the power of the ionized argon pump laser (P) for two transmission values of the output mirror of the laser cavity, namely respectively 10% and 1%. If one takes account of the 60% fraction of the pump radiation effectively absorbed by the sample, it is possible to deduce from this that the yeild of the laser emission is about 21% for a mirror transmission rate of 10%, which is relatively high.

By inserting a Lyot filter (13, FIG. 4), it is possible to wavelength-scan the laser emission. The curve obtained is shown on FIG. 2 giving the laser power (P) according to the wavelength.

This curve shows that three emission maxima are obtained marked a, b and c for 1049.8 nm, 1061.8 nm and 1074 nm respectively. The tuneability range around the first two wavelengths is relatively narrow, namely about 2 nanometers. On the other hand, it is much wider around the third maximum (emission c) since it extends from 1066 nm to 1078 nm, that is over 12 nanometers, which is considerable for a solid laser with neodymium.

These results agree with the fluorescence spectrum of FIG. 3 with the intensities of close to If.

The fluorescence spectrum of FIG. 3 has been established at 300K; it has been obtained by using an excitation wavelength of 577 nm corresponding to the absorbtion transition[4] $I_{9/2}$---$^4G_{7/2}^4$, $G_{7/2}$ of the crystal.

Although this does not appear on the fluorescence and laser tuneability curves, the compound No. 23 and the compounds 1 to 14, 17 to 22 and 24 to 27 activated with neodymium have emission wavelengths close to 1.32 micrometers which may also provide the laser effect.

The fluorescence and tuneability spectrums of the strontium-neodymium-magnesium aluminates of the invention completely differ from those of the LNA and the Bagdasarov compound.

As mentioned earlier, it is possible by acting on the composition of the crystal and in particular on the strontium and lanthanide contents respectively to move the laser emission wavelength.

This wavelength displacement according to the composition of the crystal is given in the annexed table IV.

This table has been drawn up from fluorescence spectrums at 300K for monocrystals produced in the radiation concentration oven, the emission transition being the transition:

$4F_{3/2}$---$4I_{11/2}$ of $Nd^{3+}$.

This table shows that the emission wavelength increases when the amount of strontium diminishes and the amount of neodymium increases.

The wavelength shift has also been observed for emission at 1.32 μm. In fact, the compounds No 1 and No 4 of table I emit light by fluorescence at respectively 1.322 and 1.318 μm.

FIG. 4 diagrammatically shows a continuous power laser using a monocrystal of an oxide conforming to the invention.

This laser includes a laser cavity 2 containing a bar 4 of the compound 23 disposed perpendicular to the longitudinal axis 3 of the laser, the axis c of the bar being merged with the axis 3 of the laser. The corresponding laser emission is situated in the infrared spectrum (see FIG. 3). The use of the compounds 1 to 14, 17 to 22 and 24 to 27 allows for the same type of emission.

A monochromatic light source 6, such as a laser diode or a laser diode bar, makes it possible to irradiate the aluminate bar 4 via a focussing lens 7 so as to ensure optical pumping of the bar 4. A device 5 for circulating distilled water around the bar 4 ensures cooling of this bar.

The laser cavity 2 is also composed of a focussing lens 8 transforming the light emitted by the aluminate bar 4 into a parallel light beam which is sent onto an output mirror 10.

After being reflected onto this mirror 10, the luminous beam again traverses the focussing lens 8 and the amplifier medium or bar 4. The amplified laser beam is then reflected by a dichroic input mirror 12 close to the location where the bar 4 is placed; this mirror 12 is transparent to the light emitted by the monochromatic source 6 and opaque to the light emitted by the aluminate monocrystal 4.

Once it has been sufficiently amplified in the cavity 2, the laser beam is then sent outside the laser cavity via the mirror 10, which is partly transparent to the light emitted by the aluminate monocrystal 4.

The replacement of the strontium-neodymium-magnesium aluminate bar 4 by a strontium-praseodymium-magnesium aluminate conforming to the invention, such as the compound 15 or 16, results in a continuous power laser emitting in the visible spectrum and in particular in the yellow and red spectrums.

Of course, it is possible to use an aluminate bar 4 of the invention with neodymium or praseodymium combined with cerium, europium, chromium or titanium.

Similarly, it is possible to use a bar with an oxide containing holmium, erbium, thulium, possibly combined with cerium, europium, titanium or chromium, so as to obtain power lasers emitting within a wide range of wavelengths.

In particular, the use of an oxide containing holmium allows for the emission of a laser beam whose wavelength varies from 1.5 to 3 micrometers according to the selected transition.

Wavelength tuneability may be obtained with the aid of a wavelength selection system 14 inserted between the focussing lens 8 and the output mirror 10 of the laser cavity 2, this system being a Brewster angle prism type system or a Lyot filter system formed with several plates made of a double refraction material.

In addition, a solid standard 13 of the type with parallel faces may be inserted between the focussing lens 8 and the Lyot filter 14 so as to fix the emission wavelength.

The oxides of the invention may also be used in a monocrystalline form in a pulse-functioning power laser. Such a laser is shown on FIG. 5.

This pulsed laser includes a cavity 15 containing a monocrystalline bar 16 of an oxide conforming to the invention and disposed parallel to the longitudinal axis 17 of the laser, the axis c of the crystal being merged with the axis 17. This oxide is the compound 3 or 1 with a high neodymium content.

High intensity xenon elongated flash lamps 18 and 20 are disposed on both sides of the bar 16, also orientated along the axis 17 of the laser. These lamps ensure a longitudinal optical pumping of the aluminate bar 16. A device 21 for circulating distilled water around the bar 16 ensures that the latter is cooled.

The laser cavity 15 is also composed on a quarter-wave plate 22 transforming the incident light polarized linearly derived from the bar 16 into a light polarized circularly. This plate 22 is contiguous to a plane mirror 24 and a divergent convex mirror 26.

After having been reflected onto the mirror 26, the enlarged luminous beam, adapted and polarized circularly, again traverses the quarter-wave plate 22, thus producing a beam polarized vertically which fully scans the amplifier medium or bar 16 whilst extracting from it the maximum amount of luminous energy.

The amplified laser beam extending into the direction of another highly reflecting concave mirror 28 outside the cavity 15 is interrupted by a polarizer prism 30 ejecting the vertically polarized beam 32 outside the laser cavity. A focussing lens 34 makes it possible to obtain a parallel light beam.

This pulsed laser is further equipped with an electro-optical switch 36, more generally known as a "Q switch", disposed between the concave mirror 28 and the output polarizer 30.

When this switch is off or closed, that is when a voltage is applied to it, the laser is unable to function. In fact, whilst the amplifier medium is optically "pumped" with the lamps 18 and 20, the polarizer 30 is transparent to the horizontally polarized photons and allows the light to pass towards the switch 36. This switch causing the polarization direction to rotate by 90° prevents the polarizer 30 from transmitting this light.

Conversely, when the electrooptic or Q switch 36 is on or opened, the latter no longer alters the horizontal polarization derived from the polarizer, thus enabling the laser cavity 15 to amplify the light emitted by the bar 16.

A diaphragm 38 may be inserted between the switch and the polarizer so as to channel the laser light.

As previously, the neodymium-based bar 16 may be replaced by a praseodymium, holmium, erbium, thulium-based bar possibly combined with cerium, europium, chromium or titanium or a neodymium-based bar combined with cerium, europium, chromium or titanium satisfying the formula (I) referred to earlier with a view to obtaining other pulsed power lasers. This is simply effected by adapting the coating of the mirrors 26 and 28 to the sought-after laser emission wavelength.

So as to obtain a tuneable wavelength laser, for example by using an oxide conforming to the invention containing holmium or neodymium, a wavelength selection device 40, such as the one described above, needs to be inserted between the plate 22 and the mirror 24.

Of course, the lasers described above have only been given by way of illustration and other types of lasers may be equipped with a monocrystal of an oxide conforming to the invention.

In particular, it is possible to replace the bar of the laser diodes 6 by an ionized gas (argon or krypton) laser or the flash lamps 18 and 20 by a laser diode or diode bar.

These laser diodes have the advantage of being extremely small, thus significantly reducing the overall dimensions of the crystal laser. In addition, they offer a certain wavelength tuneability around 800 nm. Now, the absorption spectrum shown on FIG. 6 shows for the compound with the initial formula (II) a wide and intense absorption band between 785 and 800 nm with peaks e, f, g at 787.3, 790.4 and 797.6 nm. This absorption spectrum has been effected of 300° K.

The general aspect of this absorption spectrum is valid for all the oxides of the invention containing neodymium; only the intensity and absorption wavelengths may be slightly different. Also, the oxides with the neodymium of the invention prove to be well-adapted for pumping by laser diodes in as far as the wavelength of these diodes may be tuned so as to be found in a maximum absorption peak of the crystal.

Moreover, the absorption intensity around 800 nm of the oxides of the invention is two to three times higher than that obtained at 514 nm with an ionized argon laser or at 752 nm with an ionized krypton laser.

In addition, the laser diodes have an excellent yield of about 50% and laser conversion is about 30 to 40%, which corresponds to at least a 20% yield of the laser effect from the electric current.

By using a gas laser or flash lamps, the laser yield from the electric current is only 1%.

Laser tests obtained by laser diode pumping have been conducted on cylinders 5 mm in diameter and 5 mm high cut from the compound 23 (Sr/Nd=4) obtained by Czochralski pulling.

The laser effect has been observed (for the transition $4F_{3/2}$---$4J_{11/2}$) along the axis c of the crystal. The maximum power of the laser effect obtained has been 190 mW for 1 watt emitted by the diode. Thus, there is a laser effect efficiency p of 33% and an absorbed power threshold of 200 mW for an output mirror at 2% of transmission and a pump wavelength of 799 nm (at 0° C.).

This is clearly shown on FIG. 7 illustrating three curves C, D and E of the yield of the laser power (P') emitted by the crystal with the composition 23 according to the pump power of the diode absorbed (P) for three transmission values T of the output mirror of the laser cavity, namely respectively 2%, 4% and 6.8%. This figure shows the yields of the laser effect p.

The monocrystals of the strontium-neodymium-magnesium oxides of the invention may be used in all those applications currently using a YAG type laser emitter. In particular, these monocrystals may be used for lasers for cutting and marking materials and effecting welds.

In addition to YAG type applications, these oxides have their own applications. They are particularly suitable for pumping by laser diodes and thus to the embodiment of miniaturized devices (military applications, scientific research, medical applications). In addition, their particular emission wavelengths and their tuneability may be profitably used in optical telecommunications applications or for the polarization of certain atoms by optical pumping.

TABLE I

EXAMPLES OF MONOCRYSTALS OBTAINED IN THE RADIATION CONCENTRATION OVEN

| EX. | INITIAL MOLE COMPOSITION % | | | | | | CRYSTAL OBTAINED - COMPOSITION | CRYSTALLINE PARAMETERS (nm) | |
|---|---|---|---|---|---|---|---|---|---|
| | $SrCO_3$ | $Nd_2O_3$ | MgO | $Al_2O_3$ | | | | a | c |
| 1 | 7.143 | 3.571 | 7.143 | 82.143 | | | $Sr_{0.510}Nd_{0.490}Mg_{0.461}Al_{11.525}O_{19}$ | 0.5577 | 2.195 |
| 2 | 8.571 | 2.857 | 5.714 | 82.857 | | | $Sr_{0.586}Nd_{0.393}Mg_{0.358}Al_{11.642}O_{19}$ | 0.5573 | 2.199 |
| 3 | 5.714 | 4.286 | 8.571 | 81.429 | | | $Sr_{0.363}Nd_{0.581}Mg_{0.581}Al_{11.419}O_{18.944}$ | 0.5575 | 2.193 |
| 4 | 11.429 | 1.429 | 2.857 | 84.286 | | | $Sr_{0.787}Nd_{0.188}Mg_{0.1689}Al_{11.831}O_{18.9844}$ | 0.5568 | 2.199 |
| 5 | 12.857 | 0.714 | 1.429 | 85.000 | | | $Sr_{0.891}Nd_{0.101}Mg_{0.095}Al_{11.905}O_{19}$ | 0.5570 | 2.200 |
| 6 | 10.000 | 2.143 | 4.286 | 83.571 | | | $Sr_{0.690}Nd_{0.287}Mg_{0.297}Al_{11.703}O_{18.972}$ | 0.5570 | 2.198 |
| | $SrCO_3$ | $Nd_2O_3$ | $La_2O_3$ | MgO | $Al_2O_3$ | | | | |
| 7 | 11.429 | 1.071 | 0.357 | 2.857 | 84.286 | | $Sr_{0.780}La_{0.045}Nd_{0.150}Mg_{0.186}Al_{11.814}O_{18.9795}$ | 0.5571 | 2.199 |
| 8 | 11.429 | 0.714 | 0.714 | 2.857 | 84.286 | | $Sr_{0.728}La_{0.126}Nd_{0.103}Mg_{0.205}Al_{11.795}O_{18.969}$ | 0.5570 | 2.200 |
| 9 | 11.429 | 0.143 | 1.286 | 2.857 | 84.286 | | $Sr_{0.791}La_{0.153}Nd_{0.022}Mg_{0.181}Al_{11.819}O_{18.963}$ | 0.5570 | 2.201 |
| | $SrCO_3$ | $Gd_2O_3$ | $Nd_2O_3$ | MgO | $Al_2O_3$ | | | | |
| 10 | 11.429 | 0.714 | 0.714 | 2.857 | 84.286 | | $Sr_{0.749}Gd_{0.098}Nd_{0.100}Mg_{0.183}Al_{11.817}O_{18.9545}$ | 0.5568 | 2.198 |
| | $SrCO_3$ | $Nd_2O_3$ | $CeO_2$ | MgO | $Al_2O_3$ | | | | |
| 11 | 11.420 | 1.356 | 0.143 | 2.855 | 84.225 | | $Sr_{0.744}Nd_{0.219}Ce_{0.008}Mg_{0.197}Al_{11.803}O_{18.9845}$ | 0.5571 | 2.200 |
| 12 | 9.286 | 1.071 | 1.429 | 5 | 83.214 | | $Sr_{0.633}Nd_{0.134}Ce_{0.206}Mg_{0.303}Al_{11.697}O_{18.9915}$ | 0.5571 | 2.197 |
| | $SrCO_3$ | $Nd_2O_3$ | $Cr_2O_3$ | MgO | $Al_2O_3$ | | | | |
| 13 | 11.429 | 1.429 | 0.0857 | 2.857 | 84.200 | | $Sr_{0.751}Nd_{0.227}Mg_{0.186}Al_{11.810}Cr_{0.004}O_{19}$ | 0.5570 | 2.199 |
| | $SrCO_3$ | $Nd_2O_3$ | $TiO_2$ | MgO | $Al_2O_3$ | | | | |
| 14 | 11.034 | 1.379 | 6.896 | 2.759 | 77.930 | | $Sr_{0.764}Nd_{0.199}Mg_{0.234}Al_{11.695}Ti_{0.071}O_{18.9455}$ | 0.5571 | 2.202 |
| | $SrCO_3$ | $Pr_6O_{11}$ | MgO | $Al_2O_3$ | | | | | |
| 15 | 7.317 | 1.219 | 7.317 | 84.146 | | | $Sr_{0.480}Pr_{0.360}Mg_{0.425}Al_{11.575}O_{18.8075}$ | 0.5578 | 2.196 |
| 16 | 11.538 | 0.481 | 2.885 | 85.096 | | | $Sr_{0.740}Pr_{0.150}Mg_{0.197}Al_{11.803}O_{18.8665}$ | 0.5570 | 2.200 |
| | $SrCO_3$ | $Nd_2O_3$ | MgO | $Ga_2O_3$ | $Al_2O_3$ | | | | |
| 17 | 10.021 | 1.253 | 2.505 | 36.951 | 49.270 | | $Sr_{0.784}Nd_{0.162}Mg_{0.146}Ga_{2.110}Al_{9.744}O_{18.954}$ | 0.563 | 2.224 |
| 18 | 8.922 | 1.115 | 2.231 | 43.863 | 43.869 | | *$Sr_{0.8}Nd_{0.2}Mg_{0.2}Ga_{3.933}Al_{7.867}O_{19}$ | 0.564 | 2.225 |
| 19 | 11.429 | 1.429 | 2.857 | 28.093 | 56.193 | | *$Sr_{0.8}Nd_{0.2}Mg_{0.2}Ga_{3.933}Al_{7.867}O_{19}$ | 0.560 | 2.212 |
| 20 | 11.429 | 1.429 | 2.857 | 42.143 | 42.143 | | *$Sr_{0.8}Nd_{0.2}Mg_{0.2}Ga_{5.9}Al_{5.9}O_{19}$ | 0.5645 | 2.228 |
| 21 | 11.429 | 1.429 | 2.857 | 84.286 | — | | *$Sr_{0.8}Nd_{0.2}Mg_{0.2}Ga_{11.8}O_{19}$ | — | — |
| | $SrCO_3$ | $Nd_2O_3$ | MgO | $Cr_2O_3$ | $Ga_2O_3$ | $Al_2O_3$ | | | |
| 22 | 11.429 | 1.429 | 2.857 | 0.086 | 28.064 | 56.136 | *$Sr_{0.8}Nd_{0.2}Mg_{0.2}Cr_{0.012}Ga_{3.929}Al_{7.859}O_{19}$ | 0.5601 | 2.209 |

*Compositions still not determined by microprobe

TABLE II

EXAMPLES OF MONOCRYSTALS OBTAINED BY CZOCHRALSKI PULLING

| EX. | INITIAL MOLE COMPOSITION % | | | | CRYSTAL OBTAINED - COMPOSITION | CRYSTALLINE PARAMETERS (nm) | |
|---|---|---|---|---|---|---|---|
| | $SrCO_3$ | $Nd_2O_3$ | MgO | $Al_2O_3$ | | a | c |
| 23 | 11.429 | 1.429 | 2.857 | 84.286 | $Sr_{0.741}Nd_{0.229}Mg_{0.205}Al_{11.794}O_{18.981}$ | 0.5571 | 2.198 |
| 24 | 12.143 | 1.071 | 2.143 | 84.643 | $Sr_{0.803}Nd_{0.171}Mg_{0.174}Al_{11.826}O_{18.9725}$ | 0.557 | 2.200 |
| 25 | 10.640 | 1.645 | 2.958 | 84.757 | *$Sr_{0.741}Nd_{0.229}Mg_{0.206}Al_{11.805}O_{19}$ | 0.557 | 2.198 |
| 26 | 8.571 | 2.857 | 5.714 | 82.857 | *$Sr_{0.6}Nd_{0.4}Mg_{0.4}Al_{11.6}O_{19}$ | 0.557 | 2.196 |

TABLE III

EXAMPLES OF A MONOCRYSTAL OBTAINED BY THE VERNEUIL METHOD

| EX. | INITIAL MOLE COMPOSITION % | | | | CRYSTAL OBTAINED - COMPOSITION | CRYSTALLINE PARAMETERS (nm) | |
|---|---|---|---|---|---|---|---|
| | $SrCO_3$ | $Nd_2O_3$ | MgO | $Al_2O_3$ | | a | c |
| 27 | 11.429 | 1.429 | 2.857 | 84.286 | $Sr_{0.710}Nd_{0.264}Mg_{0.271}Al_{11.729}O_{18.9705}$ | 0.557 | 2.199 |

*COMPOSITIONS STILL NOT DETERMINED BY MICROPROBE

TABLE IV

DISPLACEMENT OF EMISSION WAVELENGTHS ACCORDING TO COMPOSITION

| Composition n° | emission a (nm) | emission b (nm) | emission c (nm) | emission d (nm) |
|---|---|---|---|---|
| 1 | 1055 | 1064.2 | — | 1079 |
| 2 | 1053.2 | 1063.4 | 1072.4 | 1076.3 |
| 4 | 1051.3 | 1063.2 | 1069.6 | 1074 |
| 5 | 1050.6 | 1062.4 | 1068.2 | 1073.6 |
| 16 | 1051.1 | 1062 | 1069 | 1073.6 |

What is claimed is:

1. Mixed single-phase strontium and lanthanide oxide with a magnetolead type crystalline structure having the following formula (I):

$$Sr_xLn1_{y1}Ln2_{y2}Ln3_{y3}M_zA_aB_bO_{19-k} \quad (I)$$

in which Ln1 represents at least one trivalent element selected from lanthane, gadolinium and yttrium; Ln2 represents at least one trivalent element selected from neodymium, praseodymium, erbium, holmium and thulium; Ln3 represents an element selected from bivalent europium or trivalent cerium with retention of electric neutrality by virtue of oxygen holes; M represents at least one bivalent metal selected from magnesium, manganese and zinc; A represents at least one trivalent metal selected from aluminium and gallium; B represents at least one trivalent transition metal selected from chromium and titanium; x, y1, y2, y3, z, a, b and k represent numbers so that $0<x<1$, $0\leq y1<1$, $0<y2<1$, $0\leq y3<1$, $0<z<1$, $10.5<a<12$, $0\leq b\leq 0.5$ and $0\leq k\leq 1$ provided that $0<x+y1+y2+y3\leq 1$ and that $11<z+a+b\leq 12$.

2. Mixed oxide according to claim 1, wherein M represents magnesium.

3. Mixed oxide according to claim 1, wherein A represents aluminium.

4. Mixed oxide according to claim 1, wherein Ln1 represents lanthane.

5. Mixed oxide according to any claim 1, wherein Ln3 represents cerium.

6. Mixed oxide according to claim 1, wherein y2 satisfied the equation $0.02\leq y2\leq 0.6$.

7. Mixed oxide according to claim 1, wherein it has the formula:

$$Sr_xLn2_{y2}Mg_zAl_aO_{19-k}.$$

8. Mixed oxide according to claim 7, wherein k=0.

9. Mixed oxide according to claim 1, wherein Ln2 represents neodymium.

10. Mixed oxide according to claim 1, wherein Ln2 represents praseodymium.

11. Mixed oxide according to claim 1, wherein it has the formula:

$$Sr_xLn1_{y1}Nd_{y2}Mg_zAl_aO_{19-k}$$

with Ln1 representing lanthane or gadolinium and $y1\neq 0$.

12. Mixed oxide according to claim 1, wherein $0.5\leq x+y1+y2+y3\leq 1$.

13. Mixed oxide according to claim 1, wherein $0\leq y1\leq 0.9$.

14. Mixed oxide according to claim 1, wherein $0\leq y3\leq 0.6$.

15. Mixed oxide according to claim 1, wherein $0.05\leq x\leq 0.95$.

16. Mixed oxide according to claim 1, wherein $0.05\leq z\leq 0.8$.

17. A laser comprising one laser cavity containing as a light emitter a monocrystal of a mixed lanthanide oxide, means for amplifying the light derived from the monocrystal, means for extracting the light outside the laser cavity and optical pumping means, wherein this mixed oxide conforms to claim 1.

18. Laser according to claim 17 and emitting inside the infrared spectrum, wherein Ln2 represents an element selected from neodymium, holmium, erbium and thulium.

19. Laser according to claim 17 and emitting inside the visible spectrum, wherein Ln2 represents praseodymium.

20. Laser according to claim 17 and wavelength-tuneable in the infrared spectrum and comprising tuneability means, wherein Ln2 represents an element selected from neodymium, holmium, thulium and erbium.

21. Laser according to claim 17, wherein $0.05\leq y2\leq 0.45$.

22. Laser according to claim 17, wherein $0.15\leq y2\leq 0.25$.

23. Laser according to claim 17, wherein the optical pumping means consist of at least one laser diode.

24. Laser according to claim 17, wherein Ln2 represents neodymium and wherein the optical pumping means consist of at least one laser diode emitting at 800 nm.

* * * * *

UNITED STATES PATENT AND TRADEMARK OFFICE
CERTIFICATE OF CORRECTION

PATENT NO. : 5,140,604

DATED : August 18, 1992

INVENTOR(S) : Sylvie Alablanche et al.

It is certified that error appears in the above-identified patent and that said Letters Patent is hereby corrected as shown below:

Column 9, line 24, "yeild" should be --yield--.

Column 13, line 60, "mmision a" should be --emission a--.

"mission b" should be --emission b--.

"mission c" should be --emission c--.

Column 15, line 15, (claim 5), delete "any".

Column 15, line 18, (claim 6), "satisfied" should be --satisfies--.

Column 16, line 11, "A laser" should be --Laser--.

Signed and Sealed this

Thirty-first Day of August, 1993

Attest:

BRUCE LEHMAN

*Attesting Officer*  Commissioner of Patents and Trademarks